United States Patent [19]

Imade et al.

[11] Patent Number: 6,129,283
[45] Date of Patent: *Oct. 10, 2000

[54] INFORMATION REPRODUCTION APPARATUS FOR OPTICALLY READING A CODE PATTERN FROM A RECORDING MEDIUM AND OUTPUTTING DESIRED INFORMATION PIECES OF THE READ CODE PATTERN

[75] Inventors: Shinichi Imade, Iruma; Hiroshi Sasaki, Hachioji, both of Japan

[73] Assignee: Olympus Optical Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/807,176

[22] Filed: Feb. 27, 1997

[51] Int. Cl.[7] .............................. G06K 19/06; G06K 7/10
[52] U.S. Cl. ............... 235/494; 235/462.25; 235/462.44; 235/472.03
[58] Field of Search ............................... 235/494, 462.25, 235/462.44, 472.03

[56] References Cited

U.S. PATENT DOCUMENTS

| | | | |
|---|---|---|---|
| 3,970,803 | 7/1976 | Kinzie, Jr. et al. | 179/100.3 |
| 4,475,153 | 10/1984 | Kihara et al. | 364/145 |
| 4,570,250 | 2/1986 | Gabritsos et al. | 369/97 |
| 5,189,292 | 2/1993 | Baterrman et al. | 235/494 |
| 5,327,510 | 7/1994 | Morikawa et al. | 382/58 |
| 5,382,776 | 1/1995 | Arii et al. | 235/375 |
| 5,481,103 | 1/1996 | Wang | 235/494 |
| 5,724,364 | 3/1998 | Mori et al. | 371/6 |
| 5,767,494 | 6/1998 | Matsueda et al. | 235/454 |
| 5,774,583 | 6/1998 | Sasaki et al. | 382/190 |
| 5,962,839 | 10/1999 | Eskildsen | 235/472.01 |

FOREIGN PATENT DOCUMENTS

| | | |
|---|---|---|
| 1292483 | 11/1989 | Japan . |
| 3127341 | 5/1991 | Japan . |
| 5109068 | 4/1993 | Japan . |

OTHER PUBLICATIONS

Ohyama "Optical Sheet Memory System" Electronics and Communications in Japan, Part 2, vol. 75, No. 4, 1992.

Primary Examiner—Donald Hajec
Assistant Examiner—Douglas X. Rodriguez
Attorney, Agent, or Firm—Frishauf, Holtz, Goodman, Langer & Chick, P.C.

[57] ABSTRACT

An information reproduction apparatus performs reproduction of a recording medium in which multimedia information is recorded in a multichannel code to be separable in units of channels. An optical image pickup system reads a code, and a block data reconstruct section reconstructs blocks of data. A block selection section selects blocks corresponding to a plurality of types of channels. A channel selection section selects only a desired channel from a plurality of channels. An information reproduction section reproduces a plurality of pieces of information in the individual forms in accordance with the respective channels. An output information management section recognizes the types of plurality of pieces of information, and manages the respective information. An information output selection section selects and assigns an optimal output in accordance with the types of information. An output section outputs the information through a plurality of output devices.

18 Claims, 7 Drawing Sheets

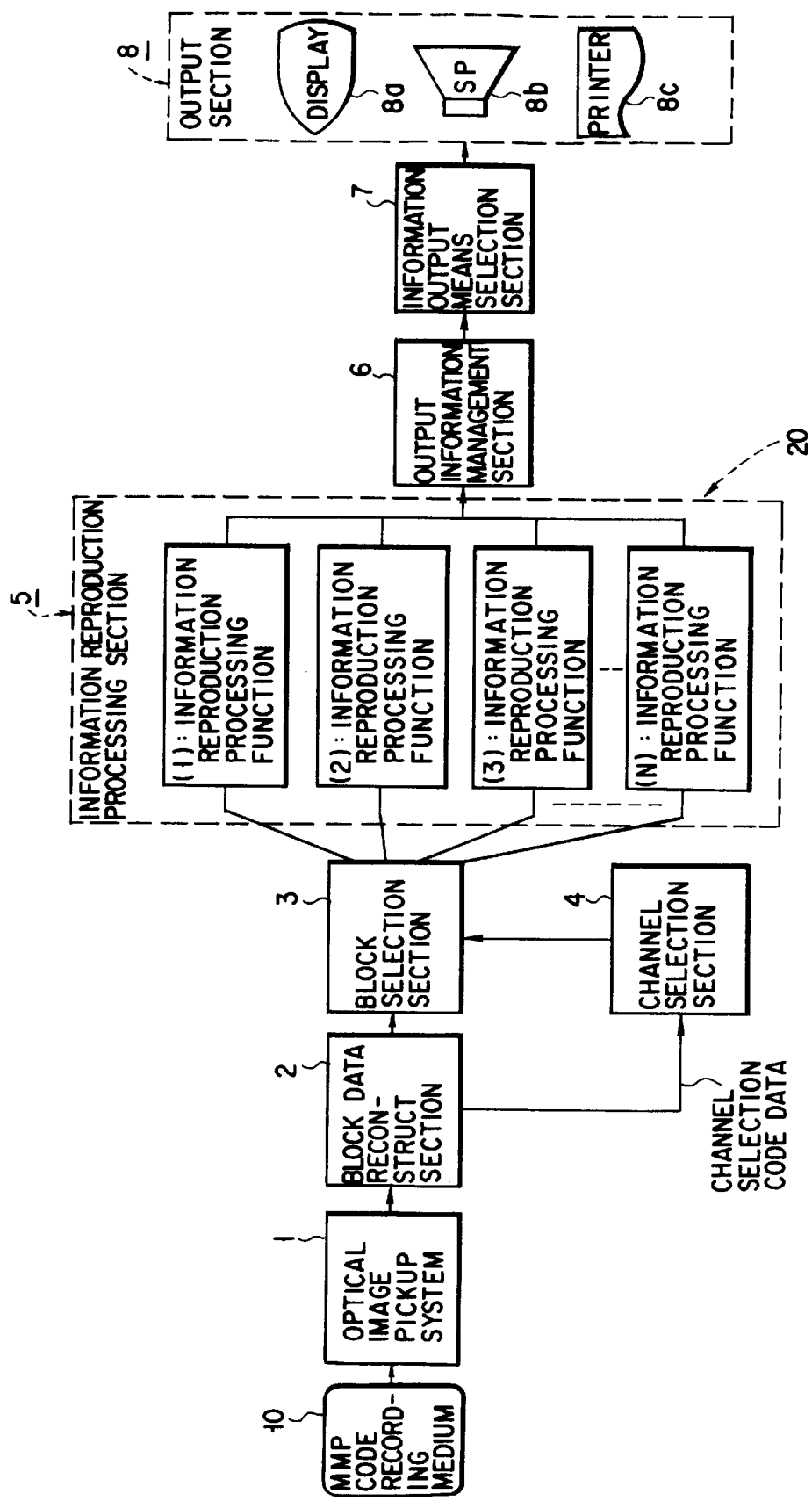
F I G. 1

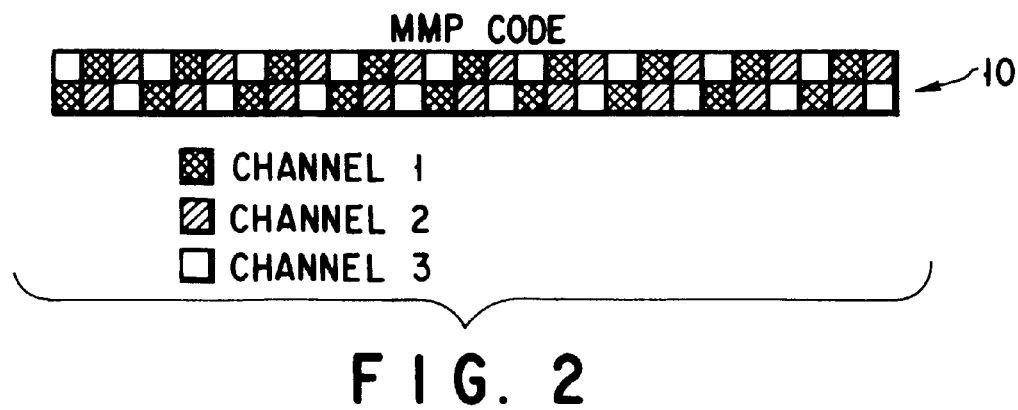
F I G. 2
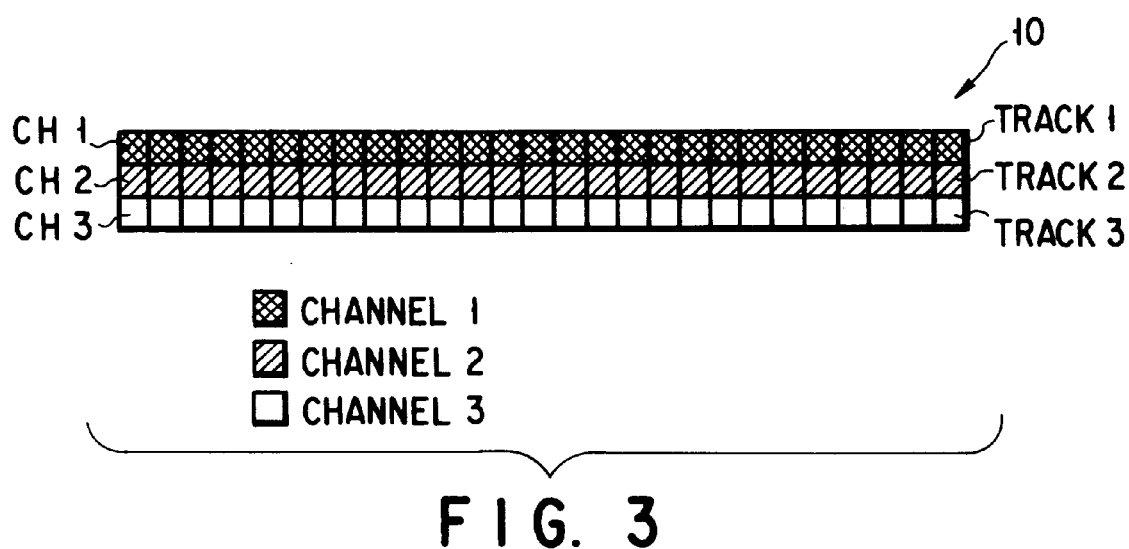
F I G. 3
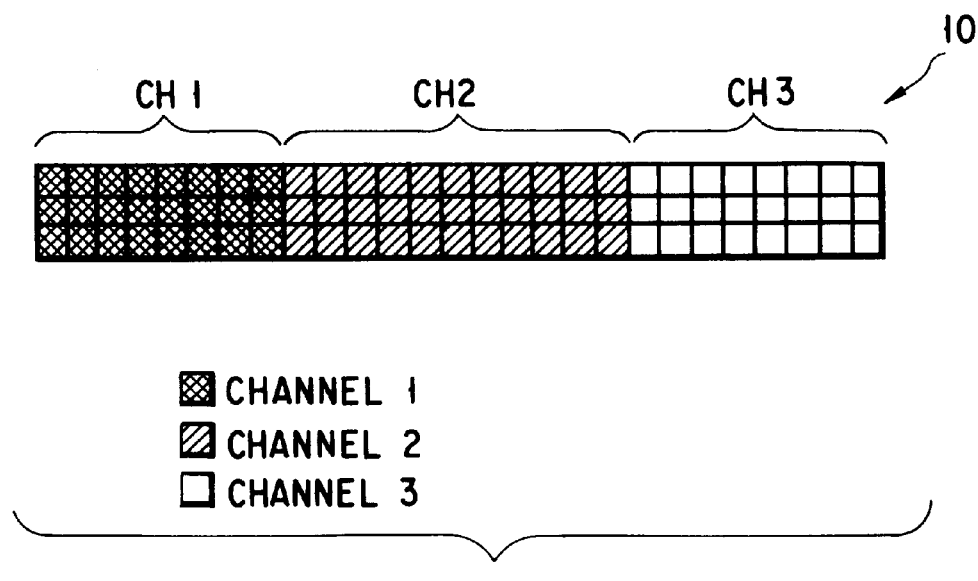
F I G. 4

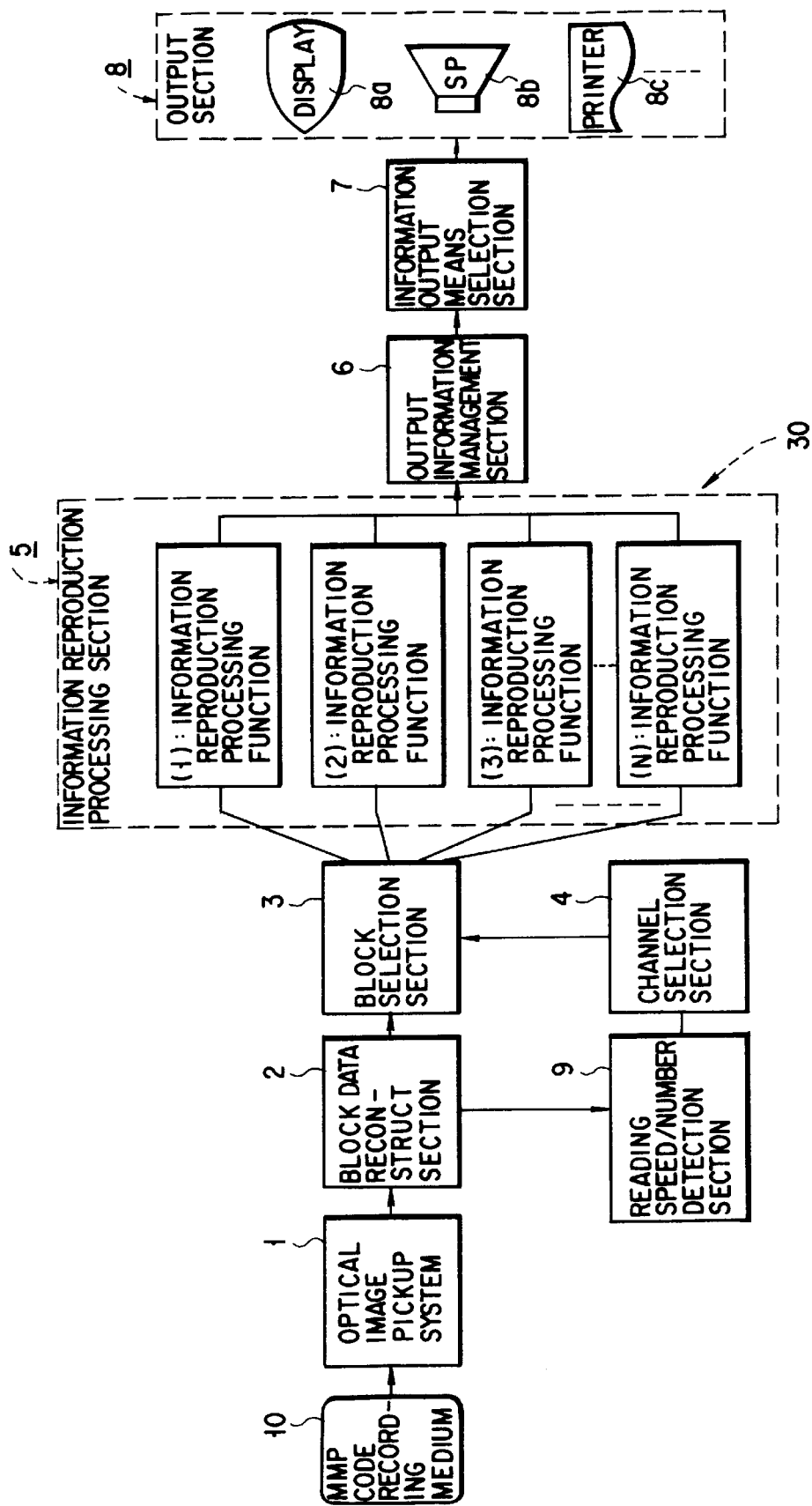
F I G. 5

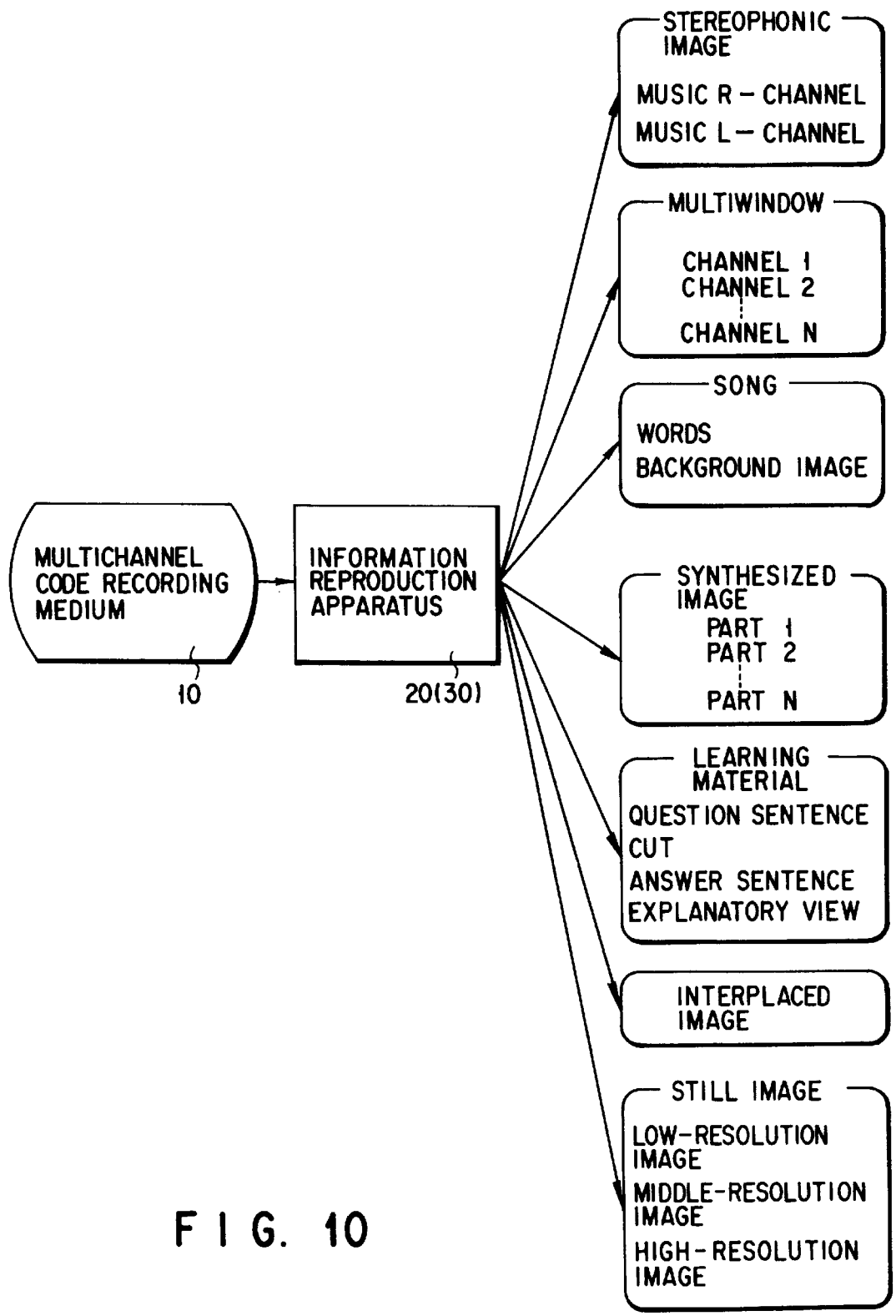
F I G. 10

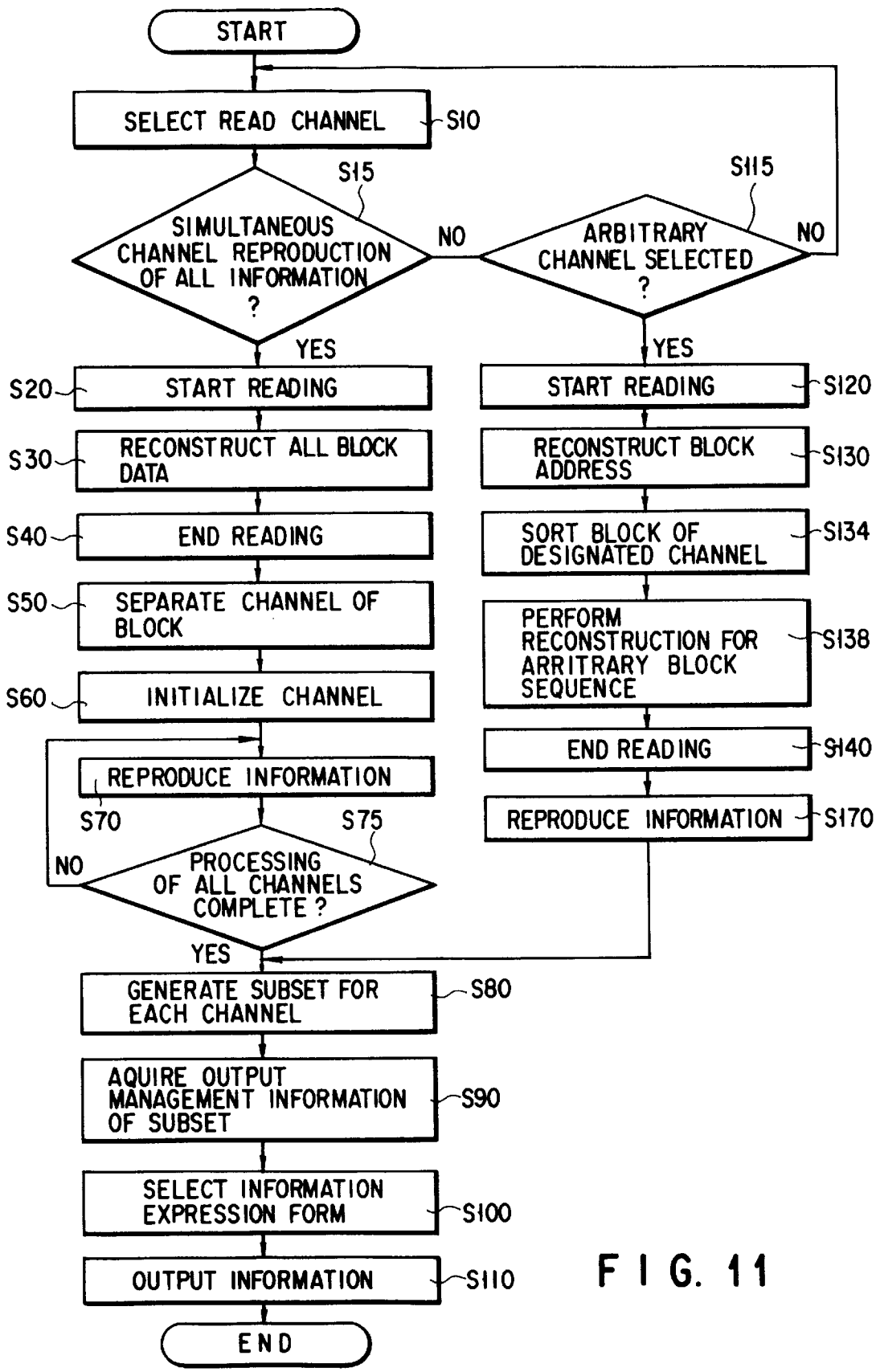
F I G. 11

INFORMATION REPRODUCTION APPARATUS FOR OPTICALLY READING A CODE PATTERN FROM A RECORDING MEDIUM AND OUTPUTTING DESIRED INFORMATION PIECES OF THE READ CODE PATTERN

BACKGROUND OF THE INVENTION

The present invention relates to a code recording medium in which multimedia information is recorded in a code pattern, and an information reproduction apparatus which optically reads the code pattern from the code recording medium, reconstructs and reproduces the original multimedia information from the code pattern, and outputs the multimedia information.

A conventional coding technique generally does not express a code pattern including information (so-called multimedia information) whose code content can be separated into a plurality of pieces to correspond to a plurality of types of media. Instead, the conventional coding technique expresses a code pattern of a single kind of information which includes only one type of media information and which cannot be separated.

For example, a bar code is single information of a so-called "one channel" which is entirely reproduced at once by scanning and reproducing the single kind of information included in the code, e.g., numerical information.

For example, conventional information having coded audio information and recorded in a recording medium such as a sheet surface is reproduced into only a monophonic voice. That is, the conventional code is not recorded in a code pattern which is separable into a plurality of channels (so-called "multi-channels"), e.g., into right and left channels such as a stereophonic voice.

Conventionally, there is no reproduction apparatus capable of reproducing a patterned multichannel code like the one described above in correspondence with multimedia.

In recent years, multipurpose reproduction apparatuses, e.g., multipurpose output apparatuses have become available, which appeal to not only the visual and hearing senses of man by, e.g., an audio output, an image output, and a printing output, but also the other senses of the five senses of man. A demand has arisen, therefore, to output information in various forms.

With this demand, coding techniques are required to generate a code pattern that can be selectively reproduced and output in a plurality of types of output forms, i.e., a so-called "multichannel code". At the same time, an information reproduction apparatus which can reproduce and output such multichannel code in a plurality of types of desired forms is in demand.

As described above, the conventional information reproduction apparatus for performing conversion of a code using a single channel and reconstruction for the code cannot convert a code using a plurality of channels, i.e., conversion of a so-called multichannel code corresponding to a multipurpose reproduction/output apparatus for advanced multimedia, and cannot reproduce the multichannel information.

As a result, various types of media information and various new coding techniques corresponding to these media have recently been required.

BRIEF SUMMARY OF THE INVENTION

It is therefore an object of the present invention to propose a system for forming, into multichannel information, multimedia information including audio information, video information, digital code data, and the like which are recorded to be optically readable, expressing the multimedia information in accordance with a predetermined format, recording it as a printing dot pattern (to be referred to as an MMP code hereinafter) on a recording medium such as a sheet surface, reconstructing original multimedia information in accordance with the type of media, and reproducing and outputting it to a proper reproduction apparatus, and to provide a code recording medium and an information reproduction apparatus which flexibly cope with many types of output media.

The present invention particularly relates to a multichannel code pattern of multimedia information, a recording medium for recording the multichannel code pattern, and an information reproduction apparatus for reconstructing and reproducing the code. To solve the above-described drawbacks of the prior art and achieve the above object of the present invention, there is provided the following means.

According to the present invention, a code recording medium comprises a portion at which multimedia information including at least one of audio information, video information, and digital code data is recorded in an optically readable code pattern, the code pattern including a plurality of pieces of media information selectively separable.

According to the present invention, an information reproduction apparatus for reproducing an optically readable code pattern from a code recording medium having a portion at which multimedia information including at least one of audio information, video information, and digital code data is recorded in the code pattern, the code pattern including a plurality of pieces of media information selectively separable, is characterized by comprising a block reconstruction selection section for reading blocks of the code pattern of the media information, and selectively separating the blocks in accordance with an arbitrary selection instruction, an information reproduction section for connecting the selected blocks, properly selecting a reconstruction method corresponding to a type of media information, and reconstructing initial recorded media information, output management selection means for receiving the reconstructed media information and selecting output means in accordance with the type or expression form of information, and output means for outputting the selected media information as predetermined media information.

With the above means, the code recording medium of the present invention and the information reproduction apparatus for reading the code have the following effects.

Multimedia information (audio information, video information, digital code data, or the like) are recorded in an optically readable code pattern in this code recording medium. This code pattern has sets of data which are arranged in units of blocks in a predetermined form. Therefore, this code pattern can be separated into a plurality of sets in accordance with the predetermined form. The blocks separable into the plurality of sets (channels) are formed to be separable in units of areas.

The block reconstruction selection section as a component of the information reproduction apparatus reads predetermined blocks of a code pattern of media information, and selectively separates the blocks in accordance with an arbitrary selection instruction. The information reproduction processing section connects the selected blocks, selects a reconstruction method corresponding to the type of media information, and reconstructs the original recorded media information. The output management selection means receives the reconstructed media information, and selects an output means in accordance with the type or expression form of information. The output means outputs the selected media information as original media information. In this manner, a plurality of types of multimedia information are output from a multichannel code pattern to a plurality of types of output devices.

If the block reconstruction selection section further comprises a reading speed detection means and a reading number detection means, the reading speed detection means detects the reading speed of each block in scanning and reading a code pattern, and an optimal output means is selected on the basis of the detected reading speed. The reading number detection means detects the scanning number, and selects an optimal output means on the basis of the detected number.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a functional block diagram showing the arrangement of an information reproduction apparatus according to the first embodiment of the present invention;

FIG. 2 is a conceptual view showing a multichannel MMP code;

FIG. 3 is a conceptual view showing a multichannel code in which a plurality of channels are set by a track separation form;

FIG. 4 is a conceptual view showing a multichannel code in which a plurality of channels are set by sequentially separating a block area from the head end;

FIG. 5 is a functional block diagram showing the arrangement of an information reproduction apparatus according to the second embodiment of the present invention;

FIG. 10 is a schematic view showing the types of reproduction forms for multichannel visual data; and FIG. 11 is a flow chart showing a basic operation processing procedure of the information reproduction apparatus according to the present invention.

DETAILED DESCRIPTION OF THE INVENTION

Figure 6:
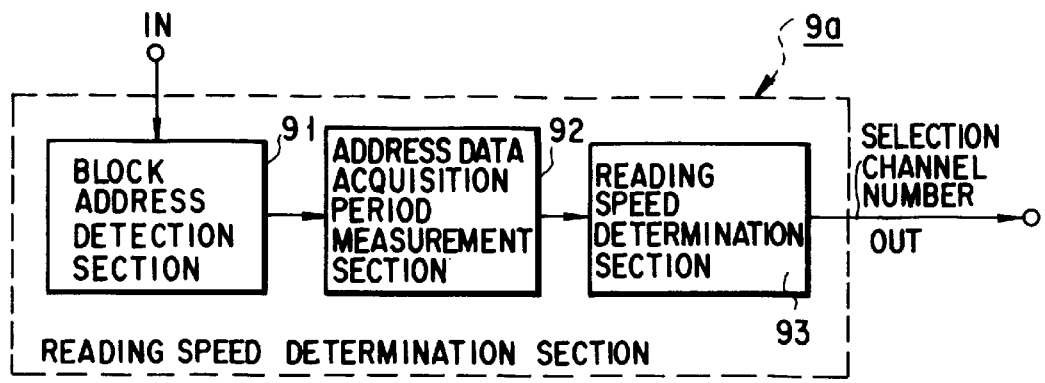
FIG. 6 is a block diagram showing the arrangement of a reading speed detection section in FIG. 5.

Reference will now be made in detail to the presently preferred embodiments of the invention as illustrated in the accompanying drawings, in which like reference characters designate like or corresponding parts throughout the several drawings.

Embodiments of the present invention will be described below with reference to the accompanying drawings.

FIG. 1 is a functional block diagram showing the arrangement of an information reproduction apparatus 20 according to the first embodiment of the present invention.

Referring to FIG. 1, an MMP code recorded in a recording medium 10 such as a sheet surface is optically read by an optical image pickup system 1.

A user can actually move a pen-like reader (not shown) incorporating a small-size image pickup system serving as the optical image pickup system 1 along the longitudinal direction of this code, thereby picking up the MMP code in the main body of the information reproduction apparatus 20.

The main body of the information reproduction apparatus 20 is constituted by the following functional blocks.

More specifically, a block data reconstruct section 2 performs reconstruction for code data from the optical image pickup system 1 in accordance with a rule or rules for reconstructing a code of the MMP system, while recognizing predetermined units (e.g., units of defined blocks) which form the code pattern of the code data. The block data reconstruct section 2 supplies the processed data to a block selection section 3, and supplies channel selection code data included in the input data to a channel selection section 4.

The block selection section 3 properly selects blocks of data corresponding to the plurality of types of channels supplied from the above-described block data reconstruct section 2, from a plurality of corresponding information reproduction processing functional units (1) to (N) of an information reproduction processing section 5 (to be described later) in accordance with a channel selection signal supplied from the channel selection section 4 (to be described later), and drives the corresponding units.

The channel selection section 4 outputs the channel selection signal to the block selection section 3 on the basis of the channel selection code data which instructs selection of a desired channel from a plurality of channels.

An output information management section 6 recognizes the type, output order, and form of information.

An information output selection section 7 properly selects an output device (to be described later) in accordance with the type of media for information to be output, and assigns the information to the selected output device.

An output section 8 reproduces and outputs at least one media information.

More specifically, the block data reconstruct section 2 first extracts an input analog signal and obtains a detection point in units of blocks, and reconstructs a digital signal of bit-string data by determining the black/white of dots constituting this block.

Upon completion of reconstruction for the input code, the reconstructed digital signal is supplied to the block selection section 3 and the channel selection section 4.

If channel "1" is designated by a selection operation with, e.g., a cyclically selectable mechanical switch on the basis of an instruction from the channel selection section 4 (to be described later), the block selection section 3 causes the information reproduction processing functional unit (1) of the information reproduction processing section 5 to reproduce information corresponding to channel 1.

If channel "0" is designated and selected by channel selection, the block selection section 3 drives all the reproduction processing functional units (1) to (N) (note that N is the maximum number of required units) corresponding to the channel numbers included in the information, and causes them to reproduce all the channels.

In this manner, the reproduction processing functions are simultaneously operated, and all the channels can be reproduced at a high speed.

According to this information reproduction processing, therefore, the reproduction time can be sensed as in reproducing a single channel without degrading the operability.

The above-mentioned channel selection section 4 supplies an instruction for assignment of a reproduction processing function which is performed by the above-described block selection section 3, by supplying, to the block selection section 3 on the basis of channel selection code data written in input block data, a predetermined selection signal which instructs whether selected channels are directly reproduced or only a desired channel is selected from these channels and reproduced.

The above-mentioned information reproduction processing section 5 comprises the information reproduction processing functions (1) to (N) consisting of a plurality of units. Each unit performs reproduction processing of only channel information assigned by the block selection section 3.

For example, each unit of the information reproduction processing section 5 edits associated information blocks to one on the basis of a predetermined rule, performs pre-processing for reproduction such as error correction processing and interleave processing, or expands compressed data, as needed.

On the basis of the data reconstructed by the information reproduction processing section 5, the above-described output information management section 6 recognizes the type of media, output order, or output form of data, manages each type of information, and supplies a series of information to the information output means selection section 7, while maintaining the independence of the information for each channel.

The information output means selection section 7 properly selects and instructs an optimal output device (e.g., a display 8a, a speaker 8b, or a printer 8c) corresponding to the type of media (e.g., visual media or hearing media) of the data managed by the output information management section 6. The information output means selection section 7 drives a corresponding device of the output section 8, and reproduces and outputs the information to the selected device of the output section 8.

The output device of the output section 8 is, e.g., the display 8a such as a CRT or an LED for video information, or the reproduction device 8b such as an acoustic speaker or a synthesizer for audio information.

The output device is the printing output device 8c such as a printer for text information. If output information is digital data, this information can be supplied as a digital output to various types of information processing terminals.

FIG. 2 shows an example of setting of a plurality of logical channels by separating a block sequence.

As shown in FIG. 2, a code pattern of the MMP system has an arrangement in which, e.g., three types of information are arrayed as a plurality of channels (i.e., channel 1, channel 2, and channel 3) on the surface of the recording medium 10 in units of identifiable blocks on the basis of a predetermined rule.

In the array of FIG. 2, blocks are aligned in two rows in the longitudinal direction of the code pattern. In each row, a pattern is formed in accordance with an array rule in which blocks corresponding to channels 1 to 3 cyclically appear in a regular order if the pattern is scanned from the left end to the right end.

The order of appearance of blocks corresponding to a plurality of types of channels can be arbitrarily changed and employ, e.g., a simple array like this example or an array in a rule based on a complicated algorithm.

FIG. 3 shows an example of setting of a plurality of channels by a track separation form.

The characteristic feature of this array form is in that information of different channels 1, 2, and 3 are arranged in a plurality of tracks aligned parallel in the longitudinal direction of a code pattern on the surface of the recording medium 10.

That is, this code pattern form expresses blocks of the same kinds of information separated in the individual tracks.

With this code pattern, the user can select desired information in units of tracks and read information from a desired start block by manually scanning the code pattern in the longitudinal direction with the above-described pen-like reader.

FIG. 4 shows an example of a code pattern of a plurality of channels in which three block areas are sequentially separated and arranged from the head end of the code pattern on the surface of the recording medium 10.

In this example, block sets each consisting of a predetermined different number (3×predetermined number) of blocks are sequentially separated and set in a plurality of block areas for channels 1, 2, 3, . . . from the head end at the left end of the code.

When the user scans the code pattern of a plurality of block areas having the above form, the user can read only a desired channel by a short scanning operation from the position of the block area to be scanned.

FIG. 5 is a functional block diagram showing the arrangement of an information reproduction apparatus 30 according to the second embodiment of the present invention.

The main difference from the first embodiment described above is that the second embodiment employs a reading speed/number detection section 9 which is connected between the block data reconstruct section 2 and the channel selection section 4 described above and detects the scanning speed and scanning number when a pen-like input unit scans a desired code pattern to read the code.

This added arrangement serves as a function for enabling execution of the above channel selection by the operation method of a code reading operation. This operation method is convenient because a channel can be selected without performing any different kind of operation procedure.

The reading speed/number detection section 9 is constituted by a reading speed detection section 9a (to be described later) like the one shown in FIG. 6 and a reading number detection section 9b (to be described later) like the one shown in FIG. 7. The reading speed/number detection section 9 measures the speed of reading a code pattern (i.e., the scanning speed) while observing a block address in the reproduced code pattern, and counts the number of reading operations (i.e., the scanning number).

The measured value is used as a reference for channel selection which will be actually performed in accordance with a predetermined rule.

In an actual operation, for example, reproduction of one channel is selected as a reproduction mode for a low reading speed, and reproduction of three channels is selected for a high reading speed.

With this setting, the reading speed sensed by the operator can be correlated with an expected information form, and an environment amicable to the operator can be provided.

For example, when the operator scans at a high speed, rough information is provided; when the operator scans carefully at a low speed, detailed information is provided, resulting in a convenient operation.

In addition, it is also possible to set stereophonic reproduction for a high reading speed and monophonic reproduction for a low reading speed.

In this manner, reproduction amicable to the sense of the operator can be performed; the operator can expect with a slow reading operation an information expression form that is normally obtained and with a quick reading operation an information expression form that is intentionally selected.

As for the number of reading operations, reproduction of one channel may be selected as a reproduction mode for one reading operation, reproduction of two channels may be selected for two reading operations, and reproduction of three channels may be selected for three reading operations.

FIG. 6 is a functional block diagram showing the arrangement of the reading speed detection section 9a as a component of the above-described reading speed/number detection section 9.

As shown in FIG. 6, the reading speed detection section 9a is constituted by a block address detection section 91, an address data acquisition period measurement section 92, and a reading speed determination section 93.

Block data output from the block data reconstruct section 2 is input to the block address detection section 91 of the reading speed detection section 9a.

The block address detection section 91 first detects the address of the input block data.

The address data acquisition period measurement section 92 measures the address acquisition period (time).

The reading speed determination section 93 receives these measured values, calculates the average value of the scanning speeds of reading a code pattern consisting of the block data on the basis of these values, and outputs, to a block selection section 3, a selection channel number as a channel to be reproduced in accordance with a rule like the one described above on the basis of the averaged speed.

The block address is always read in an information reconstruct process. By using this block address also for reading speed detection, the speed can be detected at a high use efficiency.

Figure 7:
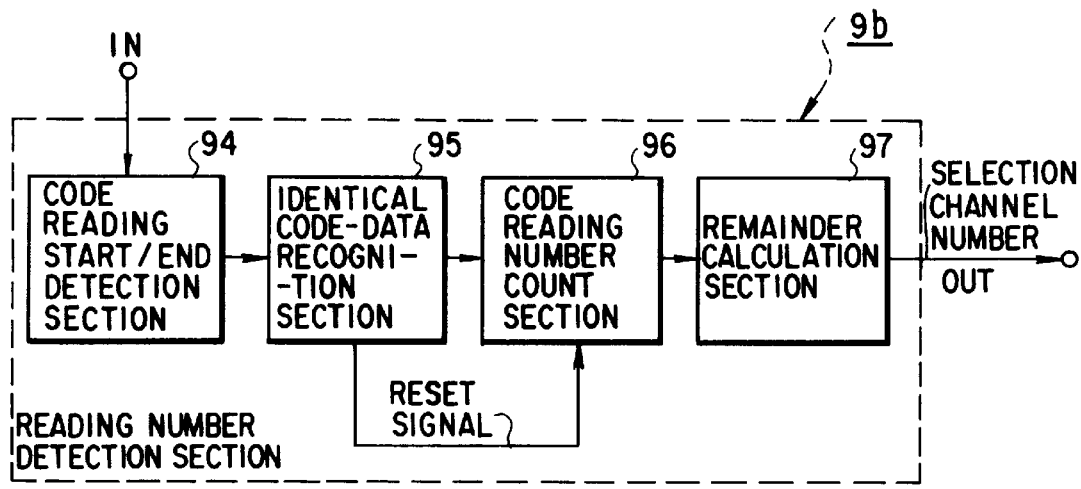
FIG. 7 is a block diagram showing the arrangement of a reading number detection section in FIG. 5.

FIG. 7 is a functional block diagram showing the arrangement of the reading number detection section 9b as a component of the above-mentioned reading speed/number detection section 9.

As shown in FIG. 7, the reading number detection section 9b is constituted by a code reading start/end detection section 94, an identical code data recognition section 95, and a code reading number count section 96.

Similar to the above description, block data output from the block data reconstruct section 2 is input to the code reading start/end detection section 94 of the reading number detection section 9b.

The code reading start/end detection section 94 first detects prescribed start and end codes representing the start and end of a code from the block data.

The identical code data recognition section 95 recognizes in units of code patterns whether the input block data is identical to the previous one.

The code reading number count section 96 has a counter which is reset on the basis of a reset signal sent from the above-described identical code data recognition section 95 each time a different code pattern is recognized. The counter counts up each time an identical code is recognized, and counts the number of reading operations.

Upon reception of this number, a remainder calculation section 97 outputs, e.g., channel 3 as a selection channel number when the remainder obtained upon a multiplication is "3".

When the remainder is "4", channel selection cyclically returns to channel 1, and the remainder calculation section 97 outputs, to the block selection section 3, a selection channel number of channel 1 as a channel to be reproduced.

This channel selection based on the reading number of identical codes can also realize the way of providing information which matches the sense of the operator.

That is, for example, information to be normally obtained can be provided by one scanning operation, and specific information can be selected by two or more scanning operations.

Since whether an identical code is read is automatically determined by the above means, the load of the operator does not increase.

Figure 8:
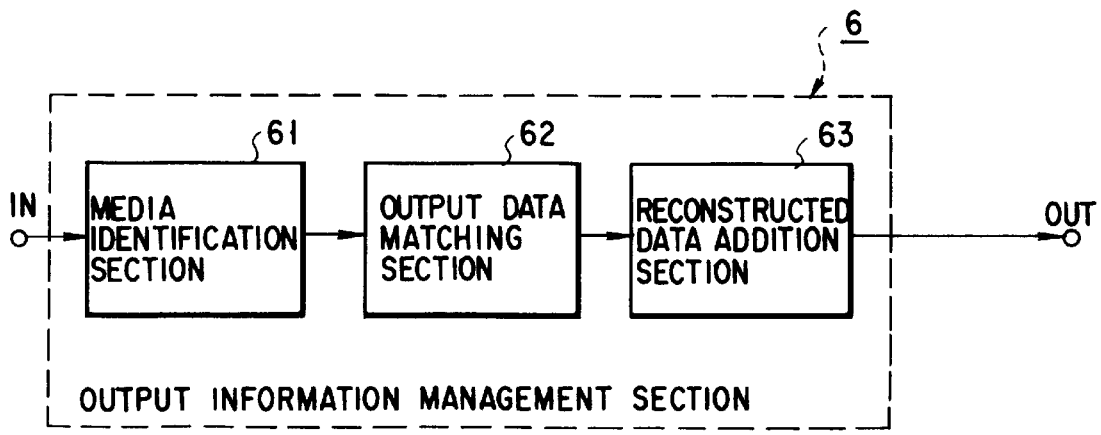
FIG. 8 is a block diagram showing the arrangement of an output information management section in FIG. 5.

FIG. 8 is a functional block diagram showing an example of the arrangement of an output information management section 6 shown in FIG. 5. As shown in FIG. 8, the output information management section 6 is constituted by a media identification section 61, an output data matching section 62, and a reconstructed data addition section 63.

First, the media identification section 61 receives information output from each of information reproduction processing functional units (1), (2), . . . , (N) of the information reproduction processing section 5, and identifies the information for a certain type of media (e.g., audio information, video information, or text information).

Next, the output data matching section 62 performs matching processing for data having a different sampling rate. Then, the reconstructed data addition section 63 edits the matched, reconstructed data by addition processing, as needed.

More specifically, e.g., of image data separately recorded in a plurality of channels, data in a low-frequency band, data in an intermediate frequency band, and data in a high-frequency band are respectively added for each channel.

In the case of a "rough" image, the respective band data are sequentially added in the order of the low-, intermediate-, and high-frequency bands.

The first low-frequency image data requires no addition.

Note that such addition processing is not always necessary depending on the operation method.

Since the reproduced information corresponds to multimedia, various types of media are mixedly used.

Since the data expression form generally changes depending on the type of media or the data format, matching processing must be performed to output data having different expression forms.

The matching processing is automatically performed in the present invention, and no load is applied to the operator. The reconstructed data addition section 63 can perform processing of editing information in detail on the basis of the read data, and easily provide hierarchical information.

Upon completion of a series of processes as described above, the generated output information, e.g. video information or audio information is output to an information output means selection section 7 which properly selects the type of device as an output destination (e.g., a display for image information or a speaker for audio information) on the basis of the type of corresponding information.

Figure 9:
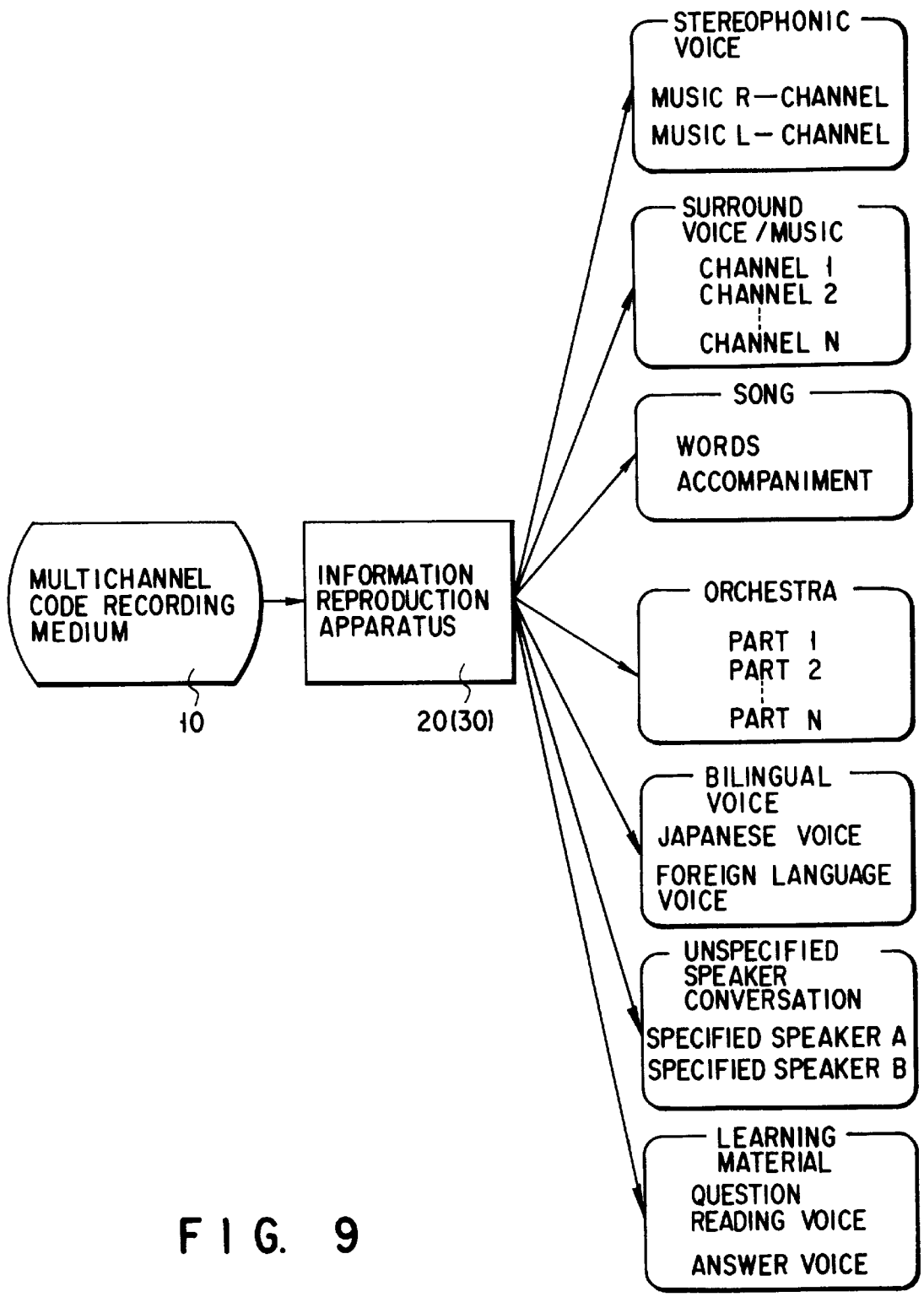
FIG. 9 is a schematic view showing the types of reproduction forms for multichannel hearing data.

FIG. 9 schematically shows the types of reproduction forms for hearing data out of multichannel data.

Multichannel-coded hearing data which is generated by the "method of generating a multichannel code" of the present invention and recorded as one code pattern like the one shown in FIG. 2, 3, or 4 in the recording medium 10 is reproduced by the information reproduction apparatus 20 or 30 shown in FIG. 1 or 5, and output and reproduced to a properly selected output device corresponding to the type of information.

For example, stereophonic audio information is supplied to an acoustic device which can simultaneously or selectively reproduce both right and left channels R-ch and L-ch.

A surround voice or a music source is output as information consisting of a large number of channels 1 to N through a large number of speakers which manage reproduction of the respective channels.

Similarly, song information is separated into words and an accompaniment and output.

An orchestra performance can be output in a full orchestra, or can be separated into a plurality of channels in units of parts to selectively output a desired recorded part.

When information about bilingual voices, an unspecified speaker conversation, and a learning material is used for a language conversation exercise and the like, at least two channels (Japanese/foreign language, speaker A/speaker B, or question/answer) can be reproduced and output so as to alternatively output a channel desired to be reproduced and heard.

In this manner, the present invention can easily meet not only the demand of the operator for obtaining synthesized information of various information as general synthesized information but also the demand for separately obtaining individual constitutional information.

FIG. 10 schematically shows the types of reproduction forms for visual data out of multichannel data.

As described above, stereoscopic image information about a multichannel image recorded as one code pattern like the one shown in FIG. 2, 3, or 4 in the recording medium 10 is reproduced by the information reproduction apparatus 20 or 30 shown in FIG. 1 or 5 to serve as a source for outputting data for both right and left channels R-ch and L-ch.

A multiwindow is also output as image information of a large number of channels 1 to N. Of a song image, the words and the background image to be displayed, and a plurality of parts of a synthesized image can be separately output as a plurality of parts 1 to N.

As for an educational visual material, a question sentence, a cut, an answer sentence, and an explanatory view can be output as information of the respective channels selectively or in an arbitrary combination.

In addition, the visual data also includes an interlaced image consisting of a plurality of (rough) images of a small number of scanning lines (i.e., a band-separated image), and still image information which can be output upon separation based on the degree (low, middle, or high) of resolution.

Next, the operation of the information reproduction apparatus according to the present invention will be described.

FIG. 11 is a flow chart showing the basic operation procedure of the information reproduction apparatus 20 or 30 shown in FIG. 1 or 5.

In a normal reading operation, when a code pattern is read from the head end by the optical image pickup system 1, the block data reconstruct section 2 performs predetermined reconstruction processing for the code pattern, supplies it to the block selection section 3, and transfers a channel selection code to the channel selection section 4. According to such a series of operations, processing is achieved.

In an actual operation, first, it must be determined whether information consisting of a plurality of channels included in a read code pattern is to be simultaneously reproduced and output using all the channels.

For this purpose, an instruction code is set near the head end of the code pattern and read by first code scanning by the operator to determine the reproduction mode. Alternatively, the operator designates the reproduction mode in advance, as follows.

For example, when the operator performs a desired operation by a predetermined method such as a predetermined operation of a click attached to a pen-like reader, a read channel selection step (S10) is executed.

The flow roughly branches into the following two processing routes in accordance with the execution result of a determination step (S15) of determining whether input information of all channels is simultaneously reproduced.

If simultaneous reproduction of all the information is designated (YES), the following processing steps are sequentially executed as a route of steps.

More specifically, a reading operation start step (S20) is executed by the block data reconstruct section 2 to turn on a green LED which permits reading, and urge the operator to scan a code.

When the operator scans a code pattern at least once, an all-block reconstruction processing step (S30) is executed to reconstruct all the block data of the read code pattern.

When the block reconstruction processing is successfully completed, a reading operation end step (S40) is executed to indicate the completion of the reading processing by turning off the green LED.

When the block reconstruction processing is unsuccessful due to occurrence of an error, a red LED is turned on to prompt the operator to read again. With these processing steps, overall information required generally is provided by an initial operation. In addition, reliable block reading and reconstruction processing can be performed.

Next, a block channel separation step (S50) is executed by the channel selection section 4 to separate, from a plurality of channels, only channel data selected from information separable into a plurality of channels which is recorded in the read code, on the basis of the channel selection code supplied from the block data reconstruct section 2.

Immediately before processing of selectively reproducing only the information of a certain channel, a channel initialization step (S60) is executed to perform predetermined initial setting required for the processing.

An information reproduction processing step (S70) is executed by the information reproduction processing section 5 in predetermined units to reproduce the information of the desired separated channel. At the same time, a determination step (S75) is executed to recognize whether another channel to be reproduced is present.

The determination step (S75) is repeatedly executed until all target channels are reproduced.

Upon completion of the above-described series of processing steps S20 to S75 (or S120 to S170 to be described later), a step (S80) is executed to generate a predetermined subset for each reproduced channel.

A step (S90) is executed by the output information management section 6 to obtain output management information for this subset such as the type of media, the output order, the output form, or the like.

A step (S100) is executed by the information output means selection section 7 to select an expression form of the information to be output.

Subsequently, an information output step (S110) is executed by the output section 8 to properly assign an output device corresponding to the type of information and output the information through this output device. Then, the above series of processes are complete.

On the other hand, if simultaneous reproduction of all information is not designated (NO) in the above-described step S15, the following series of processing steps are sequentially executed, similar to the above series of processing steps.

More specifically, a determination step (S115) is executed to determine whether an arbitrary channel is selected. If NO, the flow returns to the read channel selection step (S10) again.

If an arbitrary channel is selected, the following series of processes are performed, and the flow advances to the above-described subset generation step (S80).

More specifically, the flow starts from a step (S120) of starting to read the arbitrary channel, similar to the above-mentioned step S20. A step (S130) is executed to reconstruct the block address of read block data.

A step (S134) is executed to sort a block corresponding to the arbitrarily designated channel on the basis of the reconstructed block address.

A step (S138) is executed to perform predetermined reconstruction processing for an arbitrary block sequence. Thereafter, a reading operation end step (S140) is executed to turn on the red LED and urge the operator to end a series of reading processing.

Subsequently, an information reproduction processing step (S170) is executed to separate the arbitrarily designated channel from read information having undergone reconstruction processing, and reproduce the channel. Thereafter, the flow shifts to the above-mentioned subset generation step (S80) and performs a series of processes.

As described above, the information reproduction apparatus 20 (30) of the present invention can selectively separate a desired channel from a multichannel code pattern and reproduce and output the channel by executing the respective steps.

Note that the present invention can be modified as follows.

For example, another arrangement form of blocks in units of channels can be employed in addition to the forms shown in FIGS. 2, 3, and 4.

That is, the form can be arbitrarily changed as far as the code pattern has blocks arranged to be separable in accordance with a given rule.

The block selection section 3 shown in FIG. 1 or 5 is a switching element which is selectively switched by a mechanical switch or the like. However, the block selection section 3 may employ a scheme of being selectively controlled by software.

The information reproduction processing section 5 need not have separate information reproduction processing functional units corresponding to each of the channels. The information reproduction processing section 5 may be constituted by only one multifunctional information reproduction processing unit which sequentially reproduces designated channels.

As has been described above, according to the present invention, there can be provided a recording medium in which multimedia information is recorded in a multichannel code pattern, and an information reproduction apparatus which reconstructs and reproduces the information code, so as to solve the drawbacks of the prior art and achieve the object of the present invention. Many multimedia users can use in various fields recording media which record code patterns in various information expression forms with developments in various multimedia, and information reproduction apparatuses therefor.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. An information reproducing apparatus comprising:
   a manually operable image pickup device which is manually operated to scan an optically readable code pattern printed on a recording medium, and which optically reads the optically readable code pattern while manually scanning the optically readable code pattern, said code pattern including a plurality of pieces of recorded information including at least one of audio information, video information, and digital code data;
   a selection section for selectively designating at least one of the recorded information pieces to be output;
   an information reproduction section for reproducing multimedia data corresponding to the at least one of the recorded information pieces which is selectively designated; and
   an output section for selectively outputting the reproduced multimedia data;
   wherein the selection section includes information designating means for selectively designating the at least one of the recorded information pieces to be output based on a read condition under which the image pickup device optically reads the optically readable code pattern, while being manually operated by the user to scan the optically readable code pattern.

2. The information reproduction apparatus according to claim 1, wherein the optically readable code pattern comprises a plurality of blocks which include block data in which data corresponding to the recorded information pieces is divided into predetermined units, and block address data according to which the blocks are separately identifiable.

3. The information reproduction apparatus according to claim 2, wherein the blocks are arranged in a logical structure.

4. The information reproduction apparatus according to claim 2, wherein the blocks have a physical structure.

5. The information reproduction apparatus according to claim 1, wherein the selection section is manually operable to enable a user to selectively designate the at least one of the recorded information pieces to be output.

6. The information reproduction apparatus according to claim 5, wherein the selection section comprises a manually operable mechanical switch.

7. The information reproduction apparatus according to claim 1, wherein the selection section automatically selectively designates the at least one of the recorded information pieces to be output based on selection data included in the code pattern.

8. The information reproduction apparatus according to claim 1, wherein the selection section is switchable between a selective output mode in which only the at least one of the recorded information pieces is output, and a batch output mode in which all of the recorded information pieces is output.

9. The information reproduction apparatus according to claim 1, wherein the read condition is a read speed at which the image pickup device optically reads the optically readable code pattern, while being manually operated by the user to scan the optically readable code pattern.

10. The information reproduction apparatus according to claim 9, wherein the optically readable code pattern comprises a plurality of blocks which include block data in which data corresponding to the recorded information pieces is divided into predetermined units, and block address data according to which the blocks are separately identifiable, and wherein the read speed is determined based on a detection speed at which the block address data is detected when the image pickup device is operated by the user to optically read the optically readable code pattern.

11. The information reproduction apparatus according to claim 1, wherein the read condition is a number of times the image pickup device optically reads the optically readable code pattern, while being manually operated by the user to scan the optically readable code pattern.

12. The information reproduction apparatus according to claim 11, wherein the optically readable code pattern comprises a plurality of blocks which include block data in which data corresponding to the recorded information pieces is divided into predetermined units, and block address data according to which the blocks are separately identifiable, and wherein the number of times the image pickup device is operated by the user to optically read the optically readable code pattern is determined based on a number of times at which start and end codes included in the block data are detected by the image pickup device.

13. An information reproduction method of reading an optically readable code pattern printed on a recording medium, said code pattern including a plurality of pieces of recorded information including at least one of audio information, video information, and digital code data, said method comprising the steps of:

selecting at least one of the recorded information pieces to be output based on a read condition under which a user manually scans the optically readable code pattern; and reproducing multimedia data corresponding to the at least one of the recorded information pieces to be output; and outputting the reproduced multimedia data, wherein the read condition is a reading speed at which the user manually scans the optically readable code pattern.

14. The information reproduction method according to claim 13, wherein said code pattern comprises a plurality of blocks which include block data in which data corresponding to the recorded information pieces is divided into predetermined units, and block address data according to which the blocks are separately identifiable, and wherein several sets of said plurality of blocks are assigned to respective ones of the recorded information pieces so that the user can select the information piece to be output.

15. The information reproduction method according to claim 14, wherein the blocks assigned to the respective ones of the recorded information pieces are separately identifiable.

16. The information reproduction method according to claim 13, wherein said code pattern comprises a plurality of blocks which include block data in which data corresponding to the recorded information pieces is divided into predetermined units, and block address data according to which the blocks are separately identifiable, and wherein the reading speed is determined based on a detection speed at which the block address data is detected when the user manually scans the code pattern.

17. An information reproduction method of reading an optically readable code pattern printed on a recording medium, said code pattern including a plurality of pieces of recorded information including at least one of audio information, video information, and digital code data, said method comprising the steps of:

selecting at least one of the recorded information pieces to be output based on a read condition under which a user manually scans the optically readable code pattern; and reproducing multimedia data corresponding to the at least one of the recorded information pieces to be output; and outputting the reproduced multimedia data, wherein the reading condition is a number of times the user manually scans a same code pattern.

18. The information reproduction method according to claim 17, wherein said code pattern comprises a plurality of optically readable code pattern, while being manually operated by the user to scan the optically readable code pattern.

* * * * *